US007824936B2

(12) United States Patent
Park et al.

(10) Patent No.: US 7,824,936 B2
(45) Date of Patent: Nov. 2, 2010

(54) METHOD OF MANUFACTURING DISPERSION TYPE AC INORGANIC ELECTROLUMINESCENT DEVICE AND DISPERSION TYPE AC INORGANIC ELECTROLUMINESCENT DEVICE MANUFACTURED THEREBY

(75) Inventors: Shang Hyeun Park, Yongin-si (KR); Tae Won Jeong, Yongin-si (KR); Se Gi Yu, Seongnam-si (KR); Min Jong Bae, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 196 days.

(21) Appl. No.: 12/016,642

(22) Filed: Jan. 18, 2008

(65) Prior Publication Data

US 2009/0023233 A1 Jan. 22, 2009

(30) Foreign Application Priority Data

Jul. 19, 2007 (KR) ...................... 10-2007-0072202

(51) Int. Cl.
*H01L 21/00* (2006.01)

(52) U.S. Cl. ................. 438/22; 313/503; 257/E21.002; 430/78; 430/83

(58) Field of Classification Search ................... 438/22; 257/E21.002; 313/503; 430/78, 83
See application file for complete search history.

(56) References Cited

U.S. PATENT DOCUMENTS

2005/0236984 A1 * 10/2005 Aoyama et al. ............. 313/509

FOREIGN PATENT DOCUMENTS

| | | |
|---|---|---|
| JP | 10-69979 | 3/1998 |
| KR | 2001-0090848 | 10/2001 |
| KR | 10-2002-0057639 | 7/2002 |

* cited by examiner

*Primary Examiner*—Charles D Garber
*Assistant Examiner*—Stanetta D Isaac
(74) *Attorney, Agent, or Firm*—Cantor Colburn LLP

(57) ABSTRACT

Disclosed herein is a method of preparing a low resistance metal line, is a method of manufacturing a dispersion type AC inorganic electroluminescent device and a dispersion type AC inorganic electroluminescent device manufactured thereby, in which a light-emitting layer and a dielectric layer between a lower electrode and an upper electrode are simultaneously formed through a single process using spin coating, thereby simplifying the overall manufacturing process and decreasing the manufacturing cost, and furthermore, the contact interface between the light-emitting layer and the dielectric layer is increased, therefore increasing the brightness of the device.

6 Claims, 6 Drawing Sheets

METHOD OF MANUFACTURING DISPERSION TYPE AC INORGANIC ELECTROLUMINESCENT DEVICE AND DISPERSION TYPE AC INORGANIC ELECTROLUMINESCENT DEVICE MANUFACTURED THEREBY

CROSS-REFERENCE TO RELATED APPLICATIONS

This non-provisional application claims priority under U.S.C. §119 from Korean Patent Application No. 10-2007-72202, filed on Jul. 19, 2007, the entire contents of which is herein incorporated herein in its entirety by reference.

BACKGROUND

1. Field

This disclosure is directed to a method of manufacturing a dispersion type AC inorganic electroluminescent device and a dispersion type AC inorganic electroluminescent device manufactured thereby. More particularly, specifically, the method is directed to manufacture of a dispersion type AC inorganic electroluminescent device, in which a light-emitting layer and a dielectric layer between a lower electrode and an upper electrode may be simultaneously formed in a single process that uses spin coating, thereby simplifying the overall manufacturing process and decreasing the manufacturing cost, and furthermore, the contact interface between the light-emitting layer and the dielectric layer may be increased, thus increasing the brightness of the device, and to a dispersion type AC inorganic electroluminescent device manufactured thereby.

2. Description of the Related Art

Electroluminescence has been actively applied in particular fields, including those of illumination and back light sources, since it was first discovered by Destriau in 1936. However, the application field thereof is very limited, attributable to brightness and lifespan problems. Through continuous research and development, applicability to various fields is presented. In particular, an inorganic electroluminescent device (hereinafter, referred to as an "inorganic EL device"), having a uniform planar light source and flexibility, being light, slim, short and small, and having high resistance to temperature changes, is actively used these days as the back-light device of key pads for mobile phones, and furthermore, is suitable for being mounted to various advertisement boards, illumination systems, or vehicles. Further, unlike thin film EL devices or hybrid EL devices, dispersion type inorganic EL devices are advantageous because they may be applied to a flexible substrate and may be large, and the entire process thereof may be realized through printing, thus decreasing the cost.

Therefore, the development of methods of inexpensively manufacturing a dispersion type inorganic EL device having high brightness is still required in the art.

SUMMARY

Disclosed herein is a method of manufacturing a dispersion type AC inorganic EL device, which is able to simplify the overall manufacturing process, decrease the manufacturing cost, and increase the brightness of the device.

Disclosed herein too is a dispersion type AC inorganic EL device, manufactured using the above manufacturing method.

In one embodiment, a method of manufacturing a dispersion type AC inorganic EL device, including a substrate, a lower electrode, a light-emitting layer, a dielectric layer, and an upper electrode, may include simultaneously forming the light-emitting layer and the dielectric layer on the lower electrode through spin coating.

In another embodiment, a dispersion type AC inorganic EL device may be manufactured using the above manufacturing method.

BRIEF DESCRIPTION OF THE DRAWINGS

Example embodiments will be more clearly understood from the following detailed description, taken in conjunction with the accompanying drawings. FIGS. 1~5 represent non-limiting example embodiments described herein.

FIG. 1 is a flowchart illustrating a conventional process of manufacturing a dispersion type inorganic EL device;

FIG. 2 is a flowchart illustrating a process of manufacturing a dispersion type inorganic EL device according to example embodiments;

FIG. 3 is a sectional view illustrating the dispersion type inorganic EL device, manufactured according to the example embodiments;

FIG. 5 is a graph illustrating the brightness of the dispersion type inorganic EL devices prepared as described in Example 1 and Comparative Example 1, depending on the driving voltage.

DESCRIPTION OF THE PREFERRED EMBODIMENTS

Hereinafter, a detailed description will be given of example embodiments with reference to the accompanying drawings.

As used herein, the singular forms "a," "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to one embodiment, a method of manufacturing a dispersion type AC inorganic EL device, including a substrate, a lower electrode, a light-emitting layer, a dielectric layer and an upper electrode, may include simultaneously forming the light-emitting layer and the dielectric layer on the lower electrode through spin coating.

Figure 1:
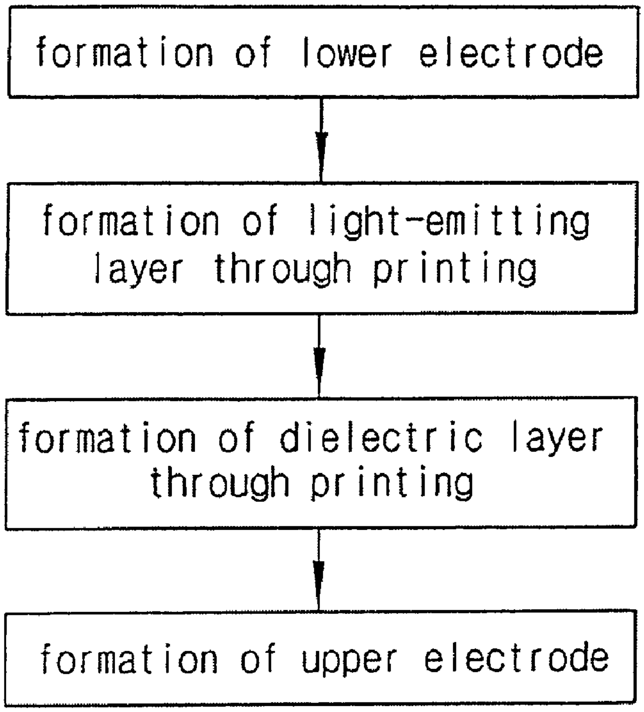
Figure 2:
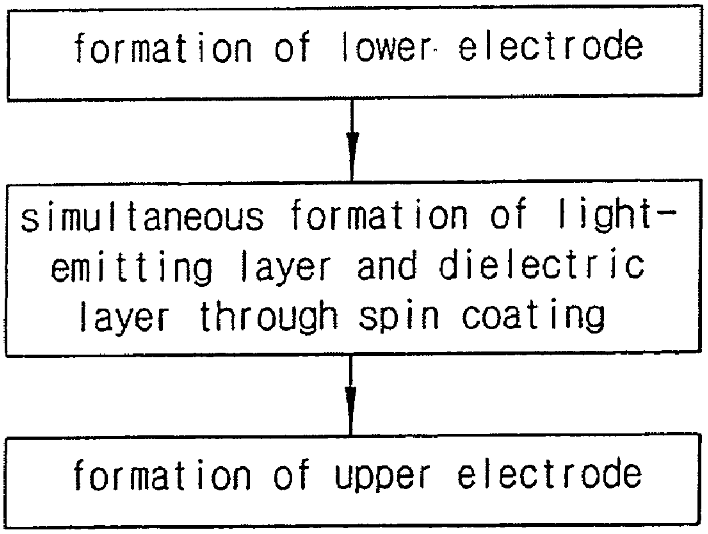

FIG. 1 provides a flowchart illustrating a conventional process of manufacturing a dispersion type inorganic EL device, and FIG. 2 is a flowchart illustrating the process of manufacturing the dispersion type inorganic EL device according to the example embodiments. Referring to FIG. 1, the conventional method of manufacturing the dispersion type inorganic EL device may include applying a transparent electrode on a substrate, forming a lower electrode through etching or direct printing, forming a light-emitting layer on the lower electrode through printing, forming a dielectric layer on the light-emitting layer through printing, and then forming an upper electrode on the dielectric layer through printing. Then, the lower electrode is connected to the upper electrode, after which AC driving is conducted, thereby realizing EL emission in the direction of the lower electrode, which is transparent.

In one embodiment, the light-emitting layer and the dielectric layer, which are separately formed by conducting a printing process twice in the conventional method, may be simultaneously formed by conducting a spin coating process only one time.

In the manufacturing method according to the example embodiments, the formation of the light-emitting layer and the dielectric layer may be conducted by mixing a phosphor with an organic binder to prepare a mixture which is then subjected to spin coating, thereby forming the light-emitting layer and the dielectric layer. When spin coating is conducted, the phosphor particles, which are relatively heavy, are oriented downward, and the organic binder is formed on the phosphor while surrounding the phosphor, thus simultaneously forming the light-emitting layer and the dielectric layer.

In the example embodiments, the organic binder plays a role as the dielectric layer of a general dispersion type inorganic EL device. The dielectric layer functions to prevent the breakdown of the device itself with respect to high voltage, which is applied from the outside to supply electrons to the light-emitting layer. Therefore, the organic binder used in the method of manufacturing the dispersion type AC inorganic EL device according to the example embodiments should include material having a high dielectric constant.

In the manufacturing method according to the example embodiments, the phosphor and the organic binder may be mixed at a mass ratio of 1:1~1:7, and preferably 1:2.

The phosphor used in the example embodiments may include a host material doped with an activator that determines the color thereof. The host material, which is the host of the phosphor, should have a high band gap, should be capable of being excited in a high electric field, and should have a lattice that is able to receive a visible light-emitting activator. Examples of the host material include Group 12-16, 13-15, and 14-14 compounds in the periodic table, and mixtures thereof, which may be appropriately selected depending on the light emission wavelength. Examples thereof include, but are not limited to, ZnS, ZnSe, GaAs, GaAlAs, GaAsP, AlGaInP, AlAs, GaP, AlP, SiC, GaN, GaInN, GaAlN, and combinations thereof.

Specific examples of the phosphor used in the example embodiments include, but are not limited to, ZnS:Cu and ZnS:Cu,Mn,Cl for emitting a red color, ZnS:Cu,Al for emitting a green color, and ZnS:Cu,Cl and ZnS:Cu,I for emitting a blue color.

The organic binder used in the example embodiments should have a high dielectric constant, and examples thereof include, but are not limited to, one or more resins selected from among cyanogenated cellulose resin, including cyanoethyl cellulose resin, cyanogenated pullulan resin, including cyanoethyl pullulan resin, fluorinated vinylidene rubber, fluorinated vinylidene-based copolymer rubber resin, and cyanogenated polyvinylalcohol, $Y_2O_3$, $Li_2O$, MgO, CaO, BaO, SrO, $Al_2O_3$, $SiO_2$, $MgTiO_3$, $CaTiO_3$, $BaTiO_3$, $SrTiO_3$, $ZrO_2$, $TiO_2$, $B_2O_3$, $PbTiO_3$, $PbZrO_3$, and $PbZrTiO_3$ (PZT).

Further, the thickness of the light-emitting layer and the dielectric layer is not particularly limited, but may range from 15 μm to 30 μm, such that the dispersion type AC inorganic EC device manufactured using the manufacturing method according to the example embodiment may exhibit brightness at an appropriate level.

According to the example embodiments, a dispersion type AC inorganic EC device may be manufactured using the manufacturing method mentioned above.

Figure 3:
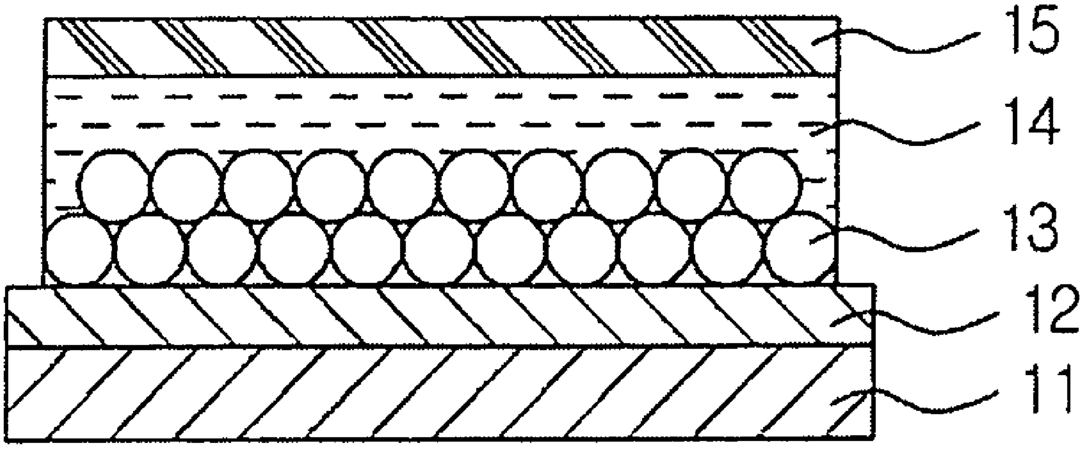

More particularly, referring to FIG. 3, the dispersion type AC inorganic EC device according to the example embodiments may have a structure including a substrate 11, a lower electrode 12, a light-emitting layer 13, a dielectric layer 14, and an upper electrode 15, which are sequentially formed. As such, the phosphor is mixed with the organic binder, and the mixture thus obtained is subjected to spin coating, thereby forming the light-emitting layer 13 and the dielectric layer 14 at the same time. Accordingly, the contact interface between the phosphor and the organic binder may be increased, and thus the brightness of the dispersion type AC inorganic EC device according to the example embodiments becomes higher than that of a general dispersion type AC inorganic EC device.

The material for the substrate used for the dispersion type AC inorganic EC device according to the example embodiments is not particularly limited, as long as it does not inhibit the purpose of the example embodiments, and examples thereof include, but are not limited to, silica, glass, and plastic, which may be appropriately selected by one skilled in the art depending on the end use. The thickness of the substrate may also be appropriately set by one skilled in the art depending on the end use.

The material for the lower electrode, which is transparent, may be used without limitation as long as it is typical and well-known, and specific examples thereof include, but are not limited to, one or more selected from among indium tin oxide (ITO), indium zinc oxide (IZO), InSnO, ZnO, $SnO_2$, NiO and $Cu_2SrO_2$, and conductive polymers, including polythiophene, polyaniline, polyacetylene, polypyrrole, polyphenylenevinylene, and a mixture of PEDOT (polyethylenedioxythiophene)/PSS (polystyrenesulfonate).

The phosphor contained in the light-emitting layer according to the example embodiments may include a host material doped with an activator that determines the color thereof. The host material, which is the host of the phosphor, should have a high band gap, should be capable of being excited in a high electric field, and should have a lattice that is able to receive a visible light-emitting activator. Examples of the host material include Group 12-16, 13-15, and 14-14 compounds in the periodic table, and mixtures thereof, which may be appropriately selected depending on the light emission wavelength. Examples thereof include, but are not limited to, ZnS, ZnSe, GaAs, GaAlAs, GaAsP, AlGaInP, AlAs, GaP, AlP, SiC, GaN, GaInN, GaAlN, and combinations thereof.

Specific examples of the phosphor used in the example embodiments include, but are not limited to, ZnS:Cu and ZnS:Cu,Mn,Cl for emitting a red color, ZnS:Cu,Al for emitting a green color, and ZnS:Cu,Cl and ZnS:Cu,I for emitting a blue color.

The organic binder contained in the dielectric layer according to the example embodiments should have a high dielectric constant, and examples thereof include, but are not limited to, one or more resins selected from among cyanogenated cellulose resin including cyanoethyl cellulose resin, cyanogenated pullulan resin including cyanoethyl pullulan resin, fluorinated vinylidene rubber, fluorinated vinylidene-based copolymer rubber resin, and cyanogenated polyvinylalcohol, $Y_2O_3$, $Li_2O$, MgO, CaO, BaO, SrO, $Al_2O_3$, $SiO_2$, $MgTiO_3$, $CaTiO_3$, $BaTiO_3$, $SrTiO_3$, $ZrO_2$, $TiO_2$, $B_2O_3$, $PbTiO_3$, $PbZrO_3$, and $PbZrTiO_3$ (PZT).

The thickness of the light-emitting layer and the dielectric layer is not particularly limited, but may range from 15 μm to 30 μm, such that the dispersion type AC inorganic EC device manufactured using the manufacturing method according to the example embodiments may exhibit brightness at an appropriate level.

The material for the upper electrode according to the example embodiments may be used without limitation as long as it is typical and well-known, and may include conductive metals or oxides thereof, specific examples thereof including, but not being limited to, nickel (Ni), platinum (Pt), gold (Au), silver (Ag), and iridium (Ir).

A better understanding of the present invention may be obtained in light of the following examples, which are set forth to illustrate, but are not to be construed to limit the present invention.

EXAMPLES

Example 1

On a glass substrate (soda lime glass) 1.8 mm thick, ITO was applied through sputtering, thus forming a lower electrode 800 Å thick. Subsequently, 5 g of a ZnS:Cu,Cl phosphor was mixed with 10 g of cyanoethyl pullulan resin, after which the mixture was applied to a thickness of 15 μm on the lower electrode through spin coating at 1000 rpm, and was then dried at 130° C. for 30 min. Before the formation of an upper electrode, the light-emitting layer of the device was observed in different directions using a scanning electron microscope. Micrographs thereof are shown in FIGS. 4A, 4B, and 4C.

Subsequently, silver (Ag) was applied to a thickness of 5 μm through printing, and was then dried at 130° C. for 30 min, thus forming the upper electrode, thereby manufacturing an inorganic EL device.

Figure 4A:
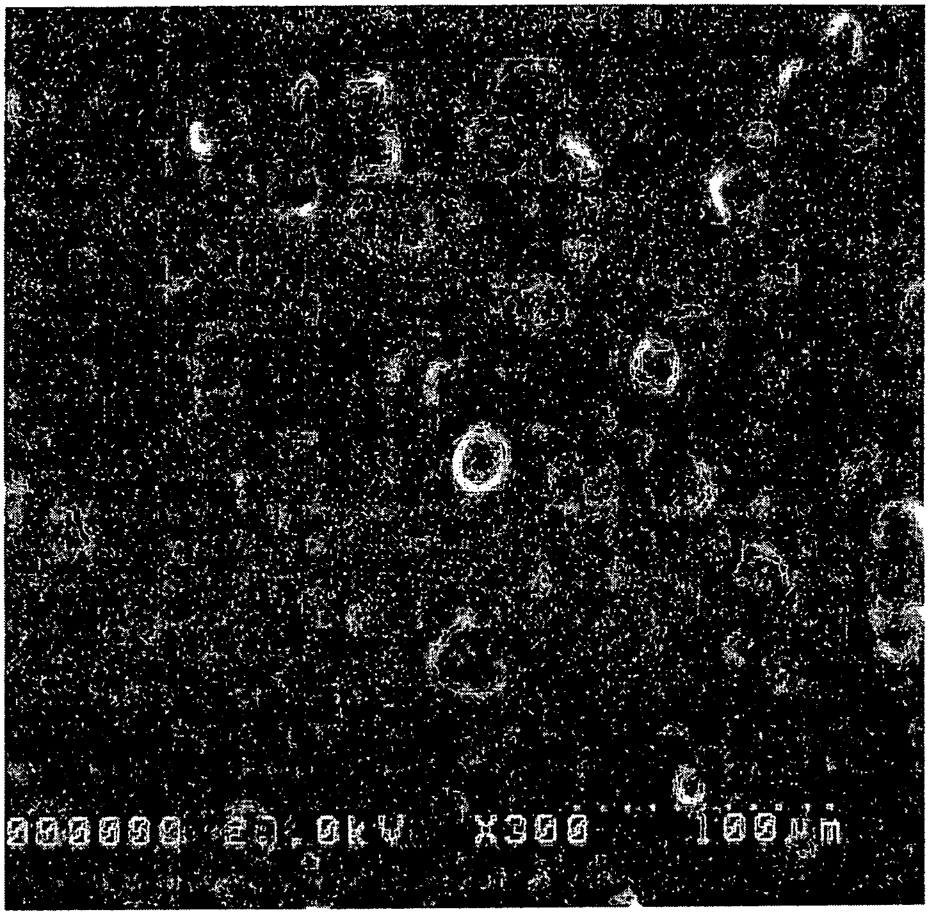
FIG. 4A is a scanning electron micrograph (SEM) illustrating the top surface of the light-emitting layer of the dispersion type inorganic EL device, before the upper electrode is formed, in Example 1.
Figure 4B:
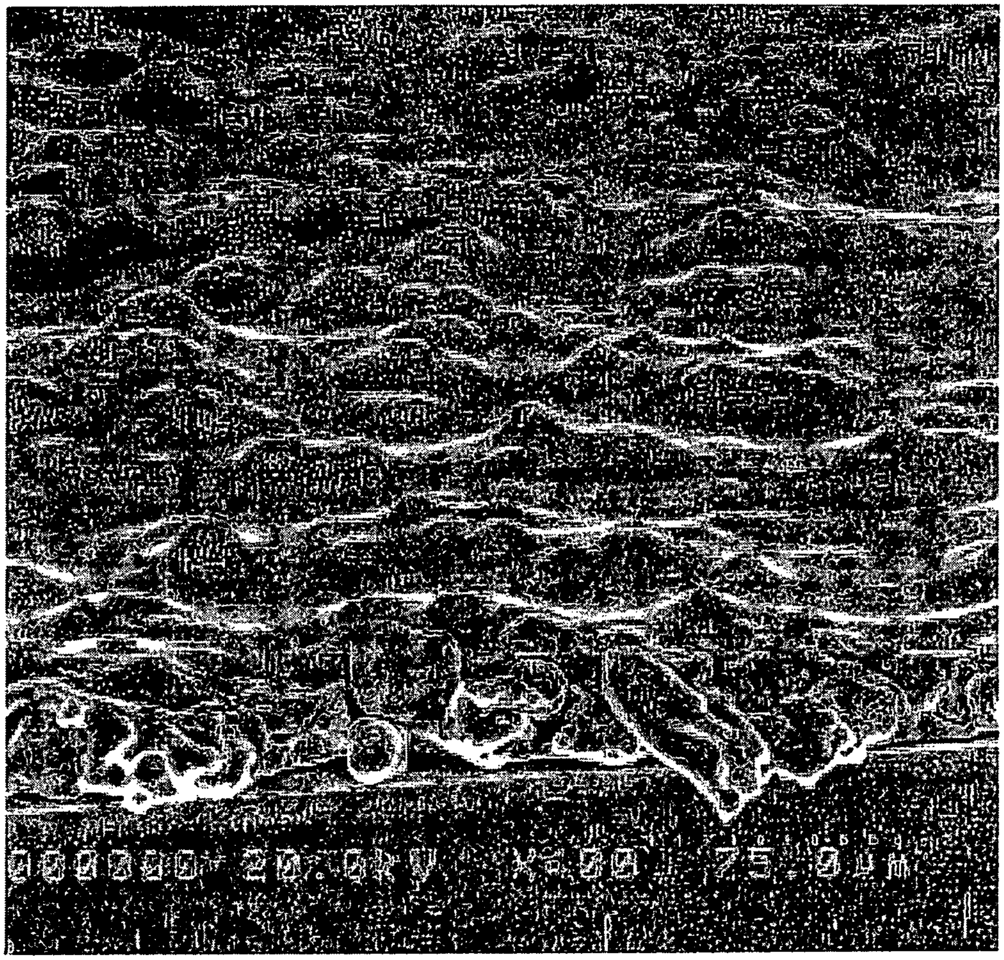
FIG. 4B is an SEM illustrating the light-emitting layer of the dispersion type inorganic EL device observed from an angle of view of 15°, before the upper electrode is formed, in Example 1.
Figure 4C:
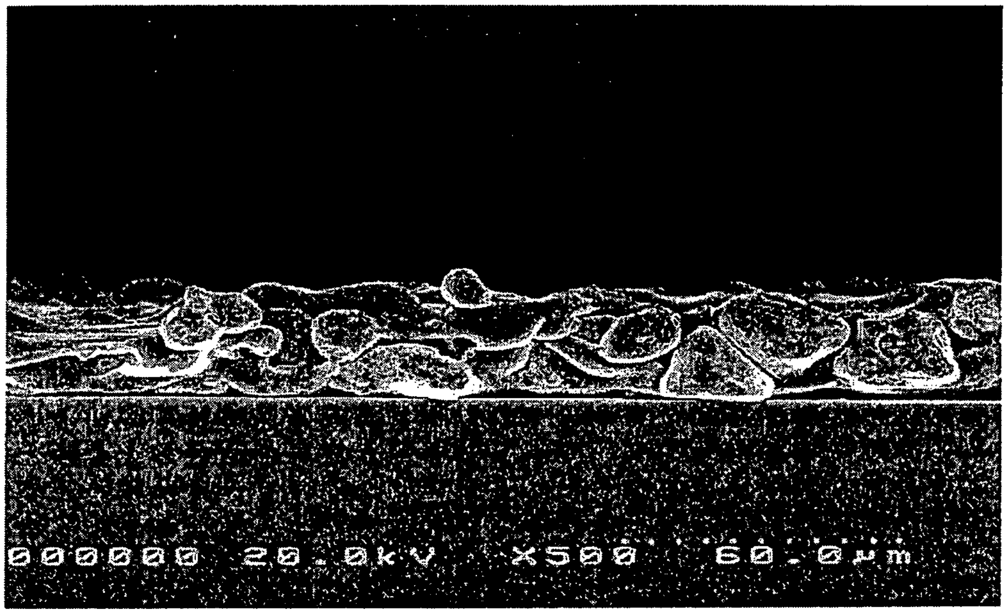
FIG. 4C is an SEM illustrating the section of the light-emitting layer of the dispersion type inorganic EL device, before the upper electrode is formed, in Example 1.

FIG. 4A is an SEM illustrating the top surface of the light-emitting layer of the dispersion type inorganic EL device, before the upper electrode is formed, in Example 1, FIG. 4B is an SEM illustrating the light-emitting layer of the dispersion type inorganic EL device observed from an angle of view of 15°, before the upper electrode is formed, in Example 1, and FIG. 4C is an SEM illustrating the section of the light-emitting layer of the dispersion type inorganic EL device, before the upper electrode is formed, in Example 1. From these drawings, it can be seen that the phosphor particles were oriented downward to thus form the light-emitting layer, and the organic binder was formed thereon to thus form the dielectric layer.

Comparative Example 1

On a glass substrate (soda lime glass) 1.8 mm thick, ITO was applied through sputtering, thus forming a lower electrode 800 Å thick. Subsequently, 5 g of a ZnS:Cu,Cl phosphor was subjected to printing, thus forming a light-emitting layer 30 μm thick, after which 10 g of $BaTiO_3$ was subjected to printing, thus forming a dielectric layer 50 μm thick. Subsequently, silver (Ag) was applied to a thickness of 5 μm through printing, thus forming an upper electrode, thereby manufacturing an inorganic EL device.

Test Example 1

Figure 5:
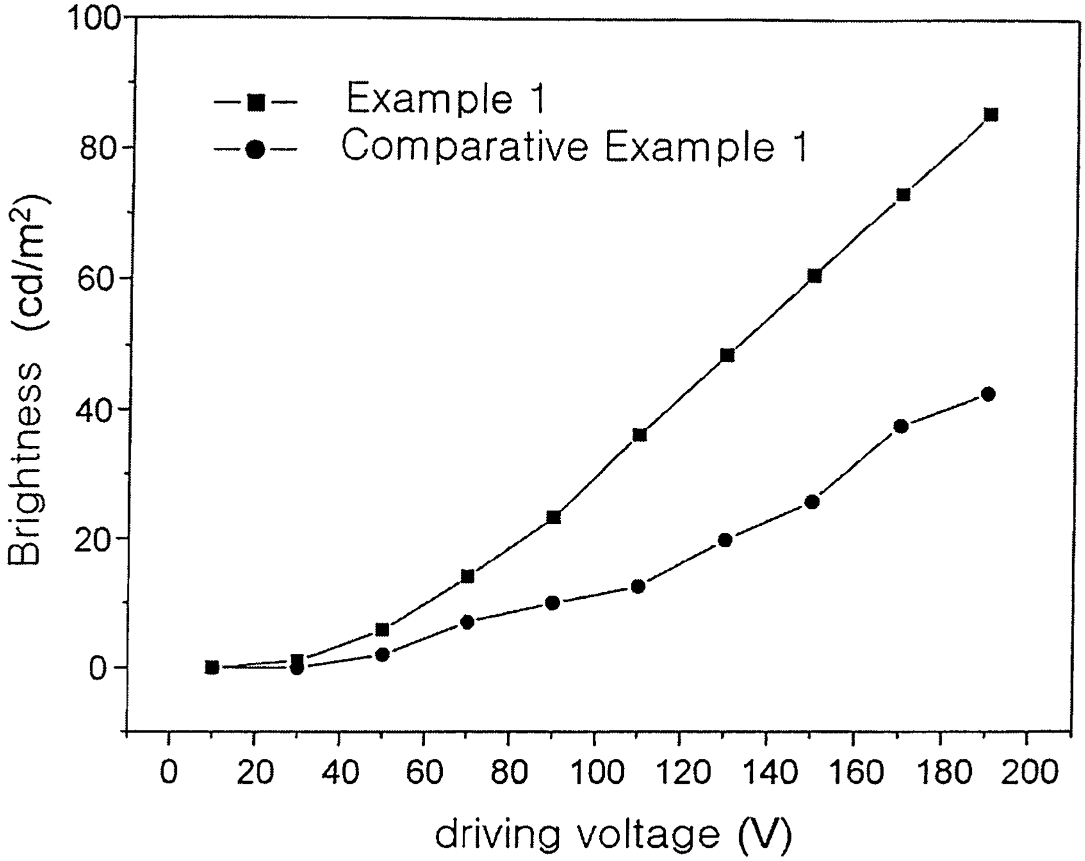

The brightness of the devices obtained in the example and comparative example was measured depending on the driving voltage. The results are shown in FIG. 5. The voltage and current applied to the connected upper and lower electrodes were measured using an infiniium oscilloscope, available from Agilent, and the brightness was measured using a luminance calorimeter (BM-7, available from TOPCON).

Referring to FIG. 5, the inorganic EL device manufactured using the manufacturing method according to the example embodiments could be seen to exhibit brightness superior to that of the device manufactured in the comparative example, which is the conventional method.

As described hereinbefore, example embodiments provide a method of manufacturing a dispersion type AC inorganic EL device and a dispersion type AC inorganic EL device manufactured thereby. According to the example embodiments, the method of manufacturing the dispersion type AC inorganic EL device is characterized in that a light-emitting layer and a dielectric layer may be formed at the same time through spin coating, thus simplifying the overall manufacturing process and decreasing the manufacturing cost, and furthermore, the contact interface between the light-emitting layer and the dielectric layer may be increased, thereby increasing the brightness of the device.

Although preferred example embodiments have been disclosed for illustrative purposes, those skilled in the art will appreciate that various modifications, additions and substitutions are possible, without departing from the scope and spirit of the accompanying claims.

What is claimed is:

1. A method of manufacturing a dispersion type AC inorganic electroluminescent device comprising a substrate, a lower electrode, a light-emitting layer, a dielectric layer, and an upper electrode, comprising:

simultaneously forming the light-emitting layer and the dielectric layer on the lower electrode through spin coating, wherein the forming the light-emitting layer and the dielectric layer is conducted by mixing a phosphor with an organic binder to prepare a mixture which is then subjected to spin coating, and wherein the phosphor and the organic binder are mixed at a mass ratio ranging from about 1:2 to about 1:7.

2. The method as set forth in claim 1, wherein the phosphor is one or more selected from a group consisting of ZnS:Cu, ZnS:Cu,Mn,Cl, ZnS:Cu,Al, ZnS:Cu,Cl, ZnS:Cu,I, and combinations thereof.

3. The method as set forth in claim 1, wherein the organic binder is a resin having a high dielectric constant.

4. The method as set forth in claim 1, wherein the organic binder is one or more selected from a group consisting of one or more resins selected from among cyanogenated cellulose resin, cyanogenated pullulan resin, fluorinated vinylidene rubber, fluorinated vinylidene-based copolymer rubber resin and cyanogenated polyvinylalcohol, $Y_2O_3$, $Li_2O$, MgO, CaO, BaO, SrO, $Al_2O_3$, $SiO_2$, $MgTiO_3$, $CaTiO_3$, $BaTiO_3$, $SrTiO_3$, $ZrO_2$, $TiO_2$, $B_2O_3$, $PbTiO_3$, $PbZrO_3$, and $PbZrTiO_3$ (PZT).

5. The method as set forth in claim 1, wherein the forming the light-emitting layer and the dielectric layer is conducted such that the light-emitting layer and the dielectric layer are formed to a thickness ranging from 15 μm to 30 μm.

6. The method as set forth in claim 1, wherein the phosphor and the organic binder are mixed at a mass ratio of 1:2.

* * * * *